United States Patent
Jung

(10) Patent No.: US 10,672,811 B2
(45) Date of Patent: Jun. 2, 2020

(54) IMAGE SENSING DEVICE

(71) Applicant: SK hynix Inc., Gyeonggi-do (KR)

(72) Inventor: Woo Yung Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/209,578

(22) Filed: Dec. 4, 2018

(65) Prior Publication Data
US 2020/0035727 A1 Jan. 30, 2020

(30) Foreign Application Priority Data
Jul. 23, 2018 (KR) .......................... 10-2018-0085203

(51) Int. Cl.
*H01L 31/0232* (2014.01)
*H01L 27/146* (2006.01)

(52) U.S. Cl.
CPC .. *H01L 27/14621* (2013.01); *H01L 27/14623* (2013.01); *H01L 27/14645* (2013.01); *H01L 27/14685* (2013.01); *H01L 27/14627* (2013.01)

(58) Field of Classification Search
CPC ......... H01L 27/14621; H01L 27/14623; H01L 27/14645; H01L 27/14685
USPC ....................................................... 257/432
See application file for complete search history.

(56) References Cited

U.S. PATENT DOCUMENTS 7,786,426 B2 8/2010 Yamashita et al.
2012/0012961 A1* 1/2012 Kataoka ............ H01L 27/14621
257/432

FOREIGN PATENT DOCUMENTS

KR 20160125099 A 10/2016

* cited by examiner

*Primary Examiner* — Tan N Tran
(74) *Attorney, Agent, or Firm* — Perkins Coie LLP

(57) ABSTRACT

An image sensing device for minimizing light reflected from a light shielding layer is disclosed. The image sensing device includes a semiconductor layer formed to include an active pixel region and an optical black pixel region, a light shielding layer located at the optical black pixel region formed over the semiconductor layer, a first color filter layer located at the active pixel region formed over the semiconductor layer, and a second color filter layer located over the light shielding layer. Each of the first and second color filter layers includes at least one first color filter, at least one second color filter, and at least one third color filter. In the first color filter layer, the first color filter, the second color filter, and the third color filter are arranged in the same layer. In the second color filter layer, the first color filter and the second color filter are arranged in the same layer whereas the third color filter is formed in another layer different from the layer of the first and second color filters.

16 Claims, 8 Drawing Sheets

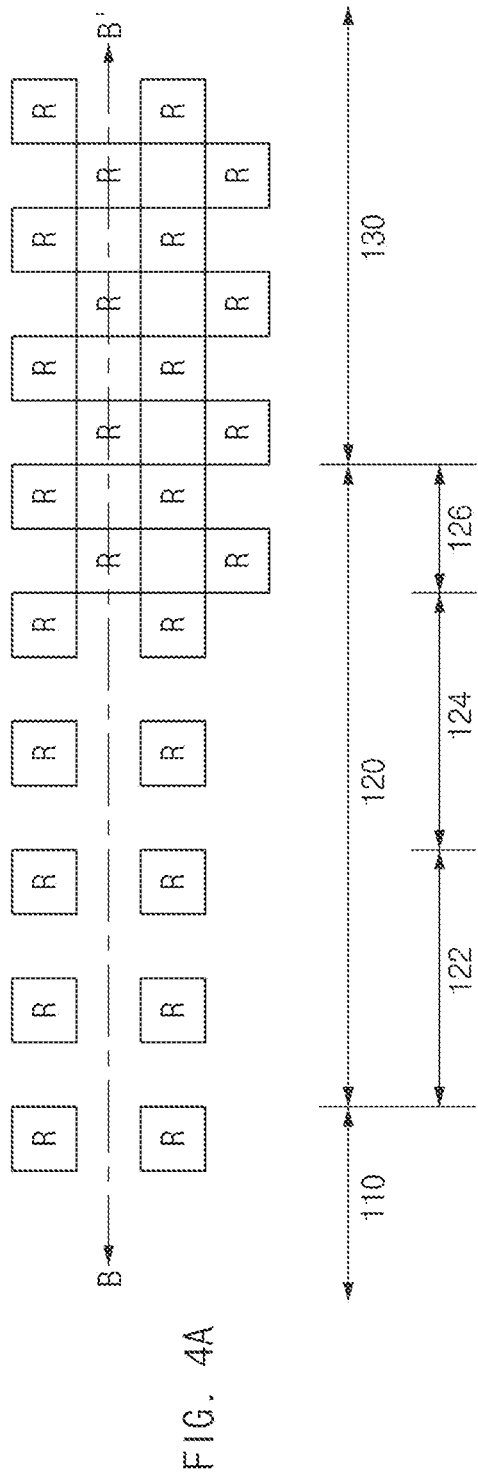
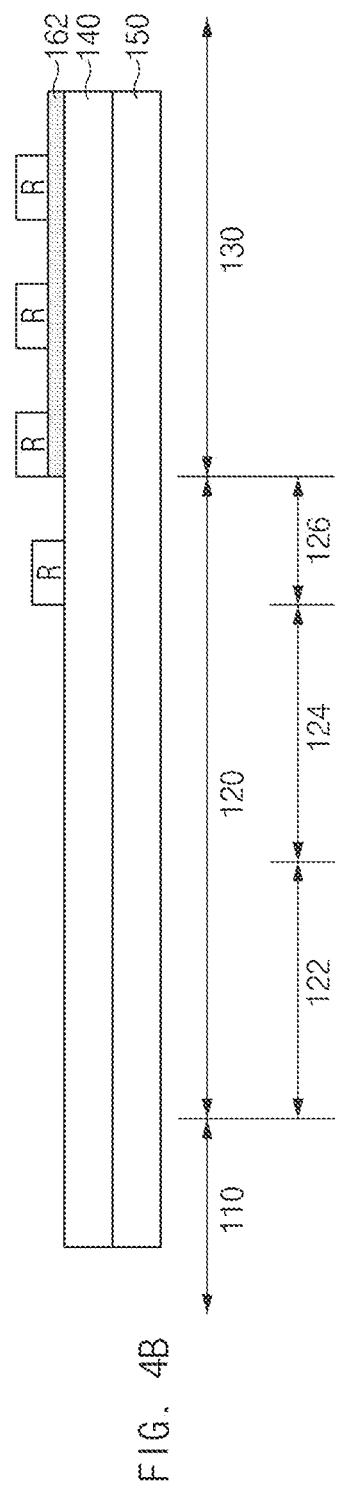
FIG. 4A
FIG. 4B

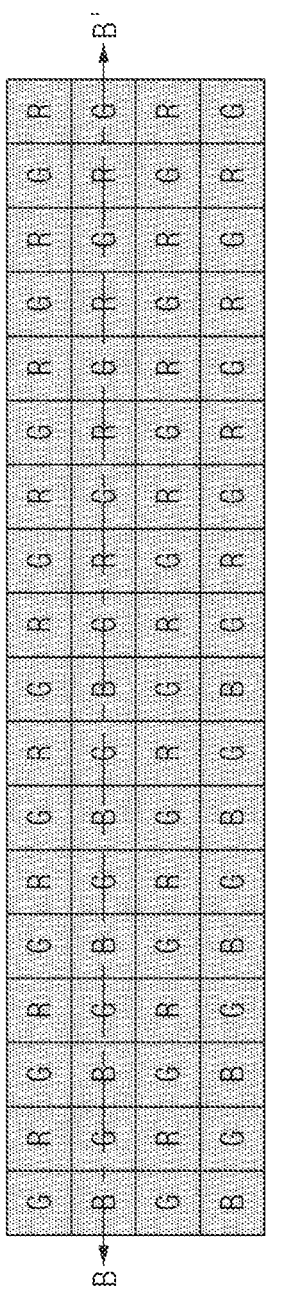
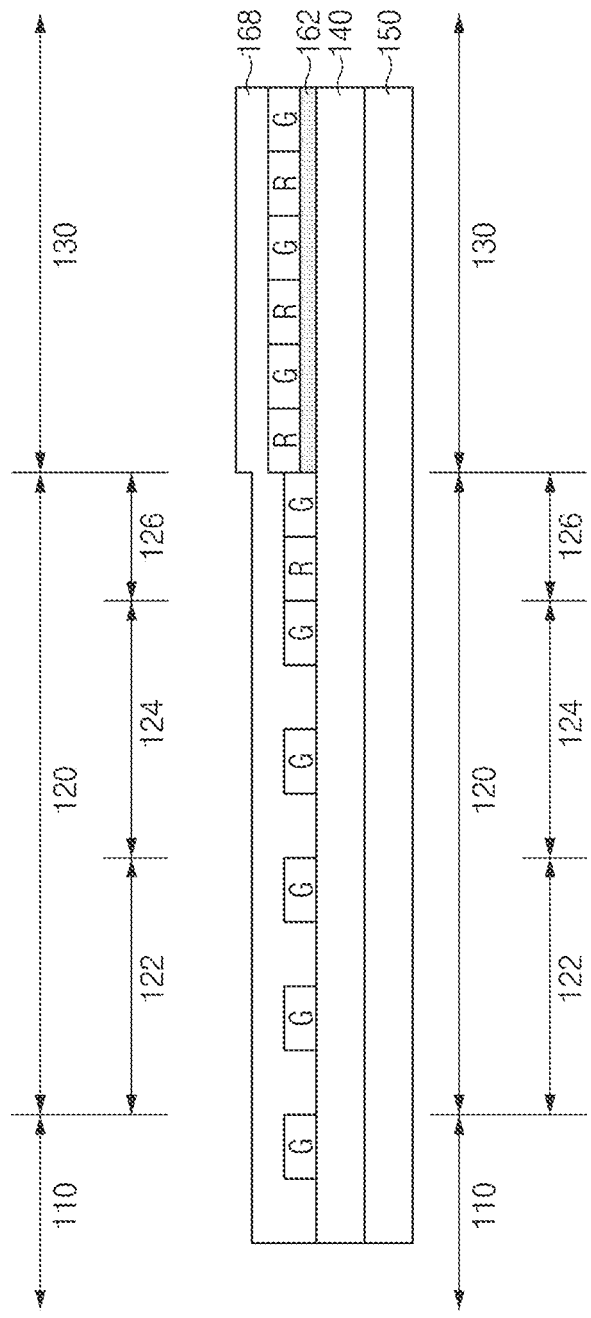
FIG. 6A
FIG. 6B

IMAGE SENSING DEVICE

CROSS-REFERENCE TO RELATED APPLICATION(S)

This patent document claims the priority and benefits to Korean patent application No. 10-2018-0085203 filed on 23 Jul. 2018, which is hereby incorporated in its entirety by reference, is claimed.

TECHNICAL FIELD

The technology and implementations disclosed in this patent document relate to an image sensing device.

BACKGROUND

An image sensing device is a device for capturing at least one image using photosensitive characteristics semiconductor that react to light. In recent times, with the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

Image sensing devices may be broadly classified into CCD (Charge Coupled Device)-based image sensing devices and CMOS (Complementary Metal Oxide Semiconductor)-based image sensing devices. Recently, since an analog control circuit and a digital control circuit can be directly implemented as a single integrated circuit (IC), CMOS-based image sensing devices have rapidly come into widespread use.

SUMMARY

This patent document provides, among others, designs of an image sensing device that substantially obviates one or more problems caused due to limitations and disadvantages of the related art.

An embodiment of the disclosed technology relates to an image sensing device capable of minimizing an amount of light reflected from a light shielding layer configured to shield light incident upon a photoelectric conversion element of an optical black pixel region.

In accordance with an aspect of the disclosed technology, an image sensing device includes a semiconductor layer formed to include an active pixel region including photosensing pixels responsive to light to produce electrical charges or signals and an optical black pixel region separated from the active pixel region and including additional photosensing pixels responsive to light to produce electrical charges or signals, a light shielding layer formed over the semiconductor layer and located in the optical black pixel region to shield the additional photosensing pixels from radiation in response to receiving light incident upon the image sensing device, a first color filter layer formed over the semiconductor layer and located in the active pixel region, and a second color filter layer located over the light shielding layer of the optical black pixel region. Each of the first and second color filter layers includes at least one first color filter, at least one second color filter, and at least one third color filter. In the second color filter layer, the first color filter and the second color filter are arranged in a same layer and the third color filter is arranged in another layer different from the layer of the first and second color filters.

In some implementations, the first color filter, the second color filter, and the third color filter are a red color filter, a green color filter, and a blue color filter, respectively. In some implementations, the first to third color filters are arranged in a Bayer pattern in the first color filter layer. In some implementations, the second color filter layer includes: a lower filter layer in which the first color filter and the second color filter are alternately arranged in a first direction and a second direction perpendicular to the first direction; and an upper filter layer in which the third color filter covers the lower filter layer. In some implementations, each of the first to third color filters has a same thickness.

In accordance with another aspect of the disclosed technology, an image sensing device includes a semiconductor layer formed to include an active pixel region, a dummy pixel region, and an optical black pixel region, each of the active pixel region, the dummy pixel region, and the optical black pixel region including photosensing pixels, a light shielding layer located in the optical black pixel region, the light shielding layer formed over the semiconductor layer and configured to shield the photosensing pixels in the optical black pixel region from radiation in response to receiving light incident upon the image sensing device, and a color filter layer formed over the semiconductor layer. The color filter layer includes at least one first color filter, at least one second color filter, and at least one third color filter, the first, second, and third color filters configured to filter different colored lights from one another. The color filter layer of the active pixel region include the first color filter, the second color filter, and the third color filter that are arranged in single layer. The color filter layer of the optical black pixel region formed over the light shielding layer includes the first color filter and the second color filter that are arranged in a same layer and the third color filter formed in another layer different from the same layer.

In some implementations, the first color filter, the second color filter, and the third color filter are a red color filter, a green color filter, and a blue color filter, respectively. In some implementations, the first to third color filters included in the color filter layer of the active pixel region are arranged in a Bayer pattern. In some implementations, the color filter layer formed over the light shielding layer includes: a first lower filter layer in which the first color filter and the second color filter are alternately arranged in a first direction and a second direction perpendicular to the first direction; and a first upper filter layer in which the third color filter covers the first lower filter layer. In some implementations, the dummy pixel region includes: a first dummy pixel region located adjacent to the active pixel region; a second dummy pixel region located adjacent to the first dummy pixel region; and a third dummy pixel region located between the second dummy pixel region and the optical black pixel region. In some implementations, the first dummy pixel region includes: a color filter layer including the first to third color filters that are arranged in a same manner as in the color filter layer of the active pixel region. In some implementations, the second dummy pixel region includes: a second lower filter layer in which the first to third color filters are arranged in a Bayer pattern; and a second upper filter layer in which the third color filter covers the second lower filter layer. In some implementations, the first upper filter layer and the second upper filter layer have different thicknesses from each other. In some implementations, the third dummy pixel region includes: a color filter layer including the first to third color filters that are arranged in a same manner as in the color filter layer of the optical black pixel region.

In another aspect, an image sensing device is provided to comprise: a first region arranged near a center of the image sensing dive and including photosensing pixels that detect light of a scene to produce pixel signals representing the detected scene including spatial information of the detected scene; a second region arranged to surround the first region and including photosensing pixels that are shielded from radiation in response to receiving light incident upon the image sensing device; a third region arranged between the first region and the second region and including photosensing pixels, and wherein the first region, the second region, and the third region include color filters that are arranged differently from one another.

In some implementations, the color filters included in the first region are arranged in a single layer. In some implementations, the color filters included in the second region are arranged in stacked layers such that some of the color filters cover other color filters. In some implementations, the color filters included in a part of the third region have a same arrangement as those in the first region and the color filters included in another part of the third region have a same arrangement as those in the second region. In some implementations, the image sensing device further comprises a light shielding layer disposed in the second region configured to shield the photosensing pixels in the second region. In some implementations, the color filters included in each of the first to third regions include different colored filters configured to filter different colored lights from one another.

It is to be understood that both the foregoing general description and the following detailed description of embodiments are exemplary and explanatory.

BRIEF DESCRIPTION OF THE DRAWINGS

The above and other features and advantages of the disclosed technology will become readily apparent by reference to the following detailed description when considered in conjunction with the accompanying drawings wherein:

FIGS. 4A, 4B, 5A, 5B, 6A, 6B, 7A, and 7B are conceptual diagrams illustrating a representation of an example of a method for forming color filters shown in FIGS. 2 and 3.

DETAILED OF EMBODIMENTS

The disclosed technology can be implemented to provide an image sensing device including an active pixel region near a center of the image sensing device including optical sensing pixels for image sensing, an optical black pixel region near a periphery of the image sensing device including optical black pixels substantially unaffected or little affected by light incident upon the light emitting image sensor and utilized to correct a black level or a dark level of the optical pixels. Some implementations of the disclosed technology further provide a dummy pixel region between the active pixel region and the optical black pixel region including optical sensing pixels configured to compensate for structural differences between the active pixel region and the optical black pixel region. Some implementations of the disclosed technology suggest different arrangements of color filters for the active pixel region, the dummy pixel region, and the optical black pixel region, thereby minimizing the amount of light reflected from the optical black pixel region. Thus, the disclosed technology allows to provide an improved image sensing device.

Reference will now be made in detail to certain embodiments, examples of which are illustrated in the accompanying drawings.

Figure 1:
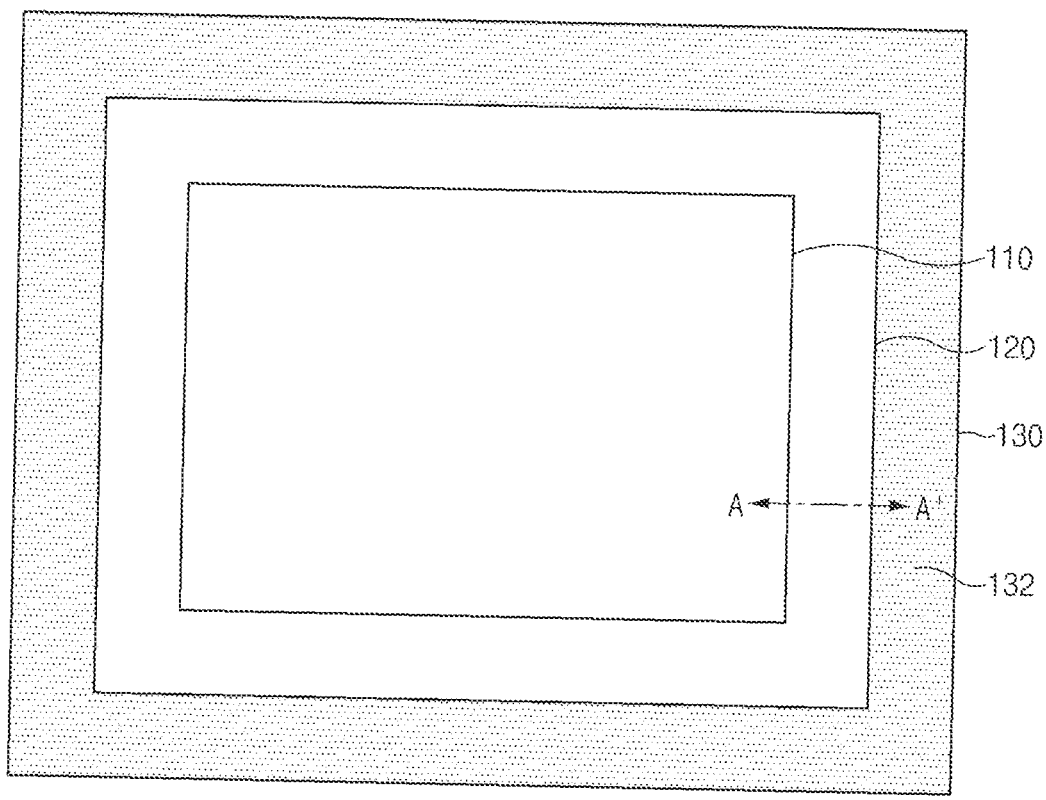
FIG. 1 is a schematic plan view illustrating a representation of an example of an image sensing device according to an embodiment of the disclosed technology.

FIG. 1 is a schematic plan view illustrating a representation of an example of an image sensing device according to an embodiment of the disclosed technology.

Referring to FIG. 1, the image sensing device 100 may include an active pixel region 110 in the central area of the device, an optical black pixel region 130 in the peripheral are of the device surrounding the active pixel region 110, and a dummy pixel region 120 located between the regions 110 and 130.

The active pixel region 110 may include a plurality of active pixels that are arranged in a two-dimensional (2D) matrix form. The active pixels are utilized to capture an image projected onto the image sensing device 100, for example, by sensing and converting light into electrical signals. Each of the active pixels may include a photoelectric conversion element for converting incident light into an electrical signal. For example, the photoelectric conversion element may include a photodiode, a phototransistor, a photogate, or a pinned photodiode.

The dummy pixel region 120 may be located outside of the active pixel region 110 while being adjacent to the active pixel region 110. The dummy pixel region 120 may include a plurality of dummy pixels identical in structure to a plurality of active pixels, and the dummy pixels may be arranged in a two-dimensional (2D) matrix form. The dummy pixels included in the dummy pixel region 120 may be distinguished from the active pixels in the active pixel region 110 in terms of the operations as not sensing and converting light into the electrical signals. The dummy pixel region 120 is disposed between the active pixel region 110 and the optical black pixel region 130 to compensate for undesired characteristics of the image sensing device 100 For example, in order to prevent an unexpected issue caused by a step difference between the active pixel region 110 and the optical black pixel region 130 by a light shielding layer 132 formed over the optical black pixel region 130, the dummy pixel region 120 may be formed between the active pixel region 110 and the optical black pixel region 130. In some implementations, according to this embodiment, the dummy pixel region 120 may have a color filter layer formed as a stacked structure of different colors of filters in a region adjacent to the optical black pixel region 130. For example, the dummy pixel region 120 may include a color filter layer in which only red (R) color filters and green (G) color filters are formed at a lower part of the color filter layer and a blue (B) color filter is formed to cover the red (R) color filter and the green (G) color filter.

The optical black pixel region 130 may be located outside of the dummy pixel region 120 and may include unit pixels (hereinafter referred to as black pixels) for correcting a black level or a dark level about the active pixel region 110. Thus, the black pixels refer to pixels that are shielded from receiving incident light and can be used, for example, to measure the pixel response in absence of incident light to measure the dark current or noise of a pixel. In some implementations, the image sensing device 100 may correct a dark current about active pixels of the active pixel region 110 with respect to dark current values output from the black pixels of the optical black pixel region 130. This shielding at the black pixels can be achieved by various ways, including, e.g., covering a light-sensitive portion of the black pixels with a light-absorbing medium or structure. As one example, the optical black pixel region 130 may include a light shielding layer 132 to shield light incident upon black pixels. In this case, the light shielding layer 132 may be formed below color filters. According to this embodiment, in order to reduce or minimize the light reflected from the light shielding layer 132, color filters of a black pixel may be formed as a stacked structure of different colors of filters. For example, a red (R) color filter, a green (G) color filter, and a blue (B) color filter are not formed at the same layer, and the blue (B) color filter is formed only over the red (R) color filter and the green (G) color filter. Details of one exemplary implementation of these color filters will be described later.

FIG. 1 illustrates an example of a specific imaging sensing device in which the dummy pixel region 120 and the optical black pixel region 130 are formed to enclose or surround the active pixel region 110. However, other implementations of the disclosed technology are possible. For example, the dummy pixel region 120 and the optical black pixel region 130 may also be formed at one or more sides of the active pixel region 110 in a horizontal or vertical direction without surrounding or enclosing the active pixel region. The size of the dummy pixel region 120 and the size of the optical black pixel region 130 may be selected based on the specific needs of a particular imaging device, e.g., according to fabrication parameters.

Figure 2:
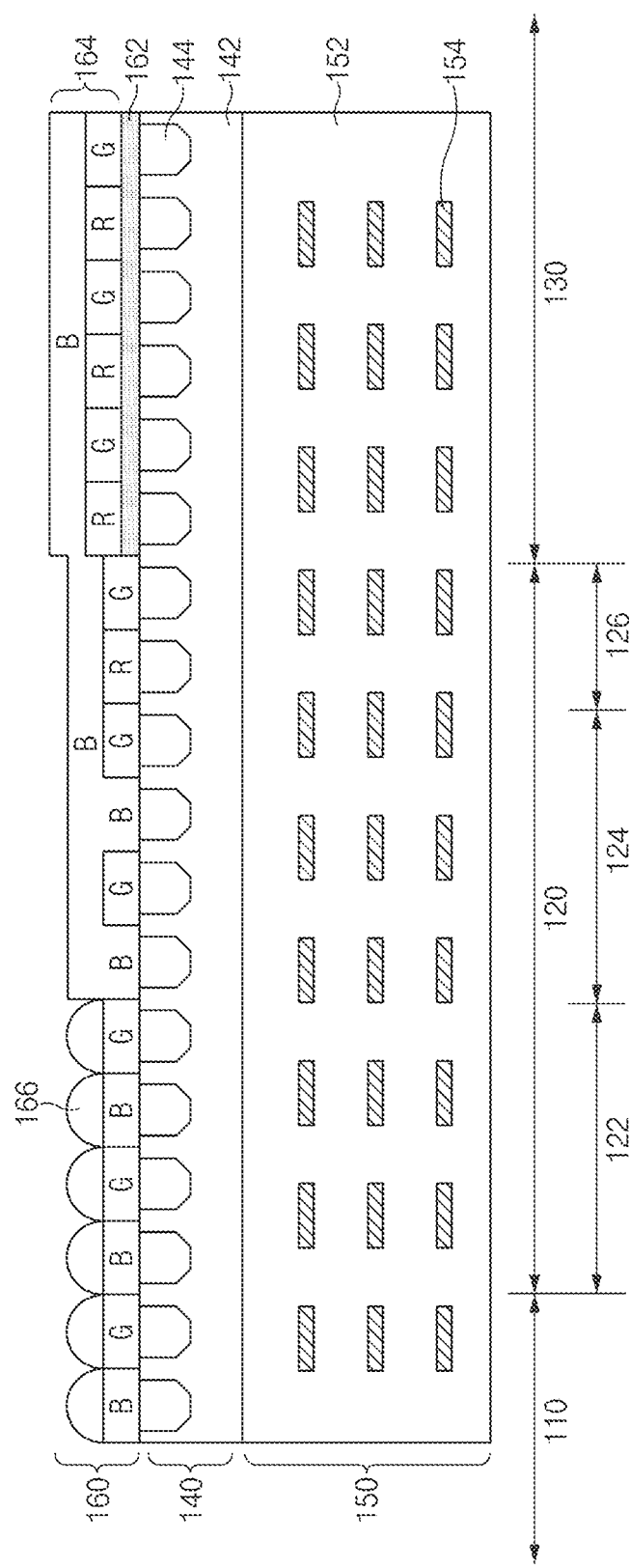
FIG. 2 is a cross-sectional view illustrating a representation of an example of the image sensing device taken along the line A-A' shown in FIG. 1.
Figure 3:
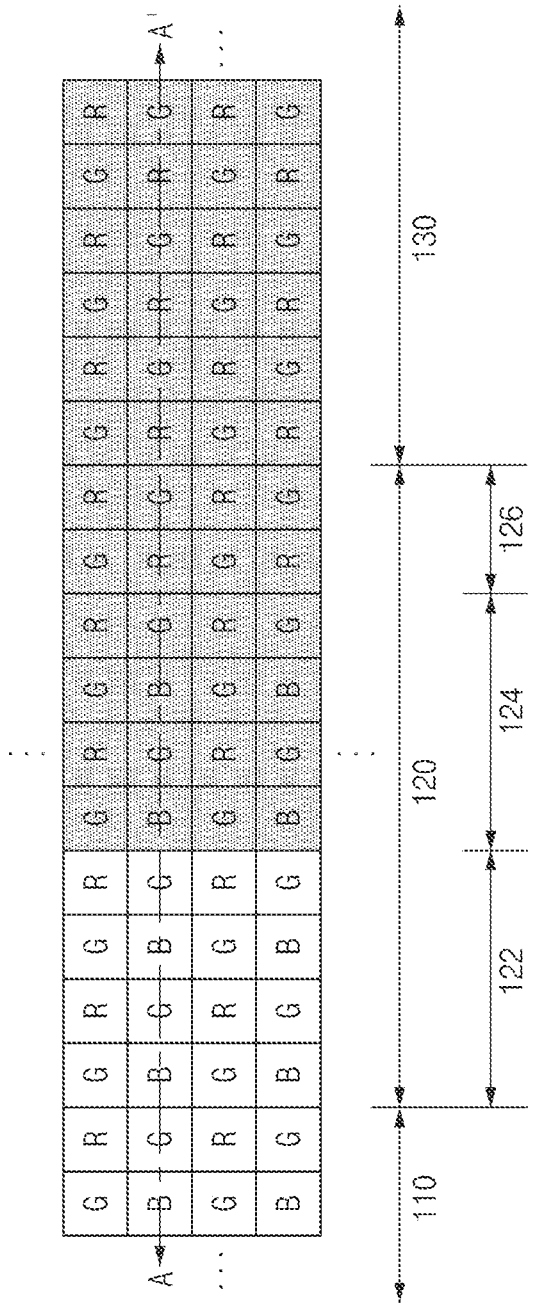
FIG. 3 is a plan view illustrating a representation of an example of an arrangement structure of color filters for use in an active pixel region, a dummy pixel region, and an optical black pixel region shown in FIG. 1.

FIG. 2 is a cross-sectional view illustrating the image sensing device taken along the line A-A' shown in FIG. 1. FIG. 3 is a plan view illustrating an example of an arrangement of color filters in the active pixel region 110, the dummy pixel region 120, and the optical black pixel region 130 shown in FIG. 1.

Referring to FIGS. 2 and 3, the image sensing device 100 may include different layers, such as a semiconductor layer 140, a wiring layer 150, and a light transmission layer 160.

The semiconductor layer 140 may include a first surface on one side to interface with the wiring layer 150 and a second surface on the opposite side of the layer to interface with the light transmission layer 160. The incident light is received via the light transmission layer 160 and is detected by photosensing regions formed in the semiconductor layer 140.

The semiconductor layer 140 may include photoelectric conversion elements 144 as the photosensing regions formed in a semiconductor substrate 142. The substrate 142 may include an N-type epitaxial layer, a bulk-silicon substrate, a Silicon On Insulator (SOI) substrate, etc.

A device isolation film (not shown) for defining active regions may be formed in the semiconductor layer 140. The active regions defined by the device isolation film may include active regions for forming photoelectric conversion elements 144 and other active regions for forming transistors configured to read out photoelectric conversion signals.

The photoelectric conversion elements 144 may be arranged, as a 2D matrix, in the semiconductor layer 140. Each of the photoelectric conversion elements may be implemented in a suitable photo sensor configuration which may include, for example, a photodiode, a phototransistor, a photogate, or a pinned photodiode.

The wiring layer 150 may include a plurality of elements for reading out electrical signals generated by the photoelectric conversion elements 142 and controlling unit pixels. The wiring layer 150 may include a plurality of interlayer insulation films 152 and a plurality of electrically conductive structures or elements such as metal lines 154 stacked or provided in the interlayer insulation films 152. Each of the interlayer insulation films 152 may include at least one of an oxide film or a nitride film. Each of the metal lines 154 may include at least one of aluminum (Al), copper (Cu), or tungsten (W). The metal lines 154 may be coupled to logic elements located at a lower part thereof through at least one contact. The metal lines 154 may be arranged separately from the photoelectric conversion elements 144 and irrespective of arrangement of the photoelectric conversion elements 144.

The light transmission layer 160 may include be implemented by a structure having different spatial regions (e.g. regions respectively corresponding to the active pixel region 110, the dummy pixel region 120 and the optical black pixel region 130) to selectively transmit incident light to the semiconductor layer 140. For example, the light transmission layer 160 may include a light shielding layer 162 above the semiconductor layer 140 in the optical black pixel region 130 to shield light from the underlying pixels in the optical black pixel region 130, a color filter layer or structure 164 with different optical color filters for filing incident light, and a plurality of micro-lenses 166 located in the active pixel region 110 to coupling incident light to pixels in the active pixel region 110.

In the illustrated example, the light shielding layer 162 disposed in the optical black pixel region 130 may include a light shielding structure formed of an optically opaque material which may include a metal such as tungsten (W) or copper (Cu).

The color filter layer or structure 164 may include a plurality of red color filters (Rs), a plurality of green color filters (Gs), and a plurality of blue color filters (Bs). Each red color filter (R) may transmit red light by filtering out visible light. Each green color filter (G) may transmit green light by filtering out visible light. Each blue color filter (B) may transmit blue light by filtering out visible light. As illustrated in FIG. 3, the color filters (Rs, Gs, and Bs) for use in the color filter layer 164 may be arranged to have different structures depending on the positions of the color filters. In FIG. 3, a region denoted by dotted lines may represent a region in which an upper filter layer is formed.

For example, the active pixel region 110 may include color filters (Rs, Gs, and Bs) arranged in a Bayer pattern shape. In this case, each of the color filters (Rs, Gs, and Bs) of the active pixel region 110 may have the same thickness (i.e., the same height), and all the color filters (Rs, Gs, and Bs) may be arranged in a single layer. The color filters (Rs, Gs, and Bs) may be formed to spatially correspond to the photoelectric conversion elements 144 of the semiconductor layer 140 on a one-to-one basis.

The dummy pixel region 120 may include first to third dummy pixel regions 122, 124, and 126. The first to third dummy pixel regions 122, 124, and 126 according to this embodiment may be discriminated from one another according to arrangement structures of color filters (i.e., according to structures of color filter layers) contained in the corresponding region.

The first dummy pixel region 122 may be located adjacent to the active pixel region 110. The color filters (Rs, Gs, and Bs) of the first dummy pixel region 122 may be arranged to have the same structure as the color filters (Rs, Gs, and Bs)

of the active pixel region 110. That is, the color filter layer of the first dummy pixel region 122 may include color filters (Rs, Gs, and Bs), each of which has the same thickness and formed in a single layer. Here, the color filters (Rs, Gs, and Bs) formed in the single layer may be arranged in a Bayer pattern. The color filters (Rs, Gs, and Bs) of the first dummy pixel region 122 may be formed to correspond to the photoelectric conversion elements 144 formed in the semiconductor layer 140 on a one-to-one basis. The color filters (Rs, Gs, and Bs) may be formed to spatially correspond to the photoelectric conversion elements 144 formed in the semiconductor layer 140.

The second dummy pixel region 124 may be formed between the first dummy pixel region 122 and the third dummy pixel region 126. The color filter layers (Rs, Gs, and Bs) of the second dummy pixel region 124 may be formed as a stacked structure of two filter layers (including a lower filter layer and an upper filter layer). The lower filter layer of the color filter layers (Rs, Gs, and Bs) may include the color filters arranged in a Bayer pattern, and the upper filter layer of the color filter layers may include the blue color filter (B) covering the lower filter layer. In this case, the blue color filter (B) of the lower filter layer and the blue color filter (B) of the upper filter layer may be integrated with each other. The color filters (Rs, Gs, and Bs) of the lower filter layer may be formed to spatially correspond to the photoelectric conversion elements 144 of the semiconductor layer 140 on a one-to-one basis.

The third dummy pixel region 126 may be located adjacent to the optical black pixel region 130. The color filters (Rs, Gs, and Bs) of the third dummy pixel region 126 may be arranged to have the same structure as the color filters (Rs, Gs, and Bs) of the optical black pixel region 130. The color filter layer of the third dummy pixel region 126 may be formed as a stacked structure of two filter layers (including a lower filter layer and an upper filter layer). In the lower filter layer, the red color filters (Rs) and the green color filters (Gs) may be alternately arranged in a first direction and a second direction perpendicular to the first direction. In the upper filter layer, the blue color filter (B) may be formed to cover the lower filter layer. That is, the lower filter layer may be composed of the red color filters (Rs) and the green color filters (Gs), which has the structure of the Bayer pattern modified by replacing the blue color filter (B) with the red color filter (R). The color filters (Rs and Gs) of the lower filter layer may be formed to spatially correspond to the photoelectric conversion elements 144 formed in the semiconductor layer 140 on a one-to-one basis. The color filters (Rs and Gs) of the lower filter layer may be formed to have the same thickness as the color filters of the active pixel region 110.

The optical black pixel region 130 may include the color filters (Rs, Gs, and Bs) arranged in the same structure as in the third dummy pixel region 126. That is, the color filters (Rs, Gs, and Bs) of the optical black pixel region 130 may be formed in a stacked structure of the lower filter layer and the upper filter layer. In the lower filter layer, the red color filters (Rs) and the green color filters (Gs) may be alternately arranged in a first direction and a second direction perpendicular to the first direction. In the upper filter layer, the blue color filter (B) may be formed to cover the lower filter layer. The lower filter layer has the Bayer pattern modified by replacing the blue color filter (B) with the red color filter (R). The color filters (Rs and Gs) of the lower filter layer may be formed to spatially correspond to the photoelectric conversion elements 144 formed in the semiconductor layer 140 on a one-to-one basis. The color filters (Rs and Gs) of the lower filter layer of the optical black pixel region 130 may be formed to have the same thickness as the color filters of the active pixel region 110, and the upper filter layer of the optical black pixel region 130 may be formed to have the same thickness as the upper filter layers of the second dummy pixel region 124 and the third dummy pixel region 126.

Although FIGS. 2 and 3 have disclosed an exemplary case in the color filter layer 164 that includes the red color filters (Rs), the green color filter (Gs), and the blue color filters (Bs) a specific color filter arrangement, the disclosed technology may be implemented based on other implementations of color filter arrangements. It should be noted that the color filter layer 164 may also include other color filters beyond the red, green and blue color filters, for example, a magenta color filter, a yellow color filter, etc.

In other implementations, micro-lenses 166 may be disposed not only over the color filters of the active pixel region 110, but also over the color filters of the first dummy pixel region 122. Each of the micro-lenses 166 may be formed to be convex upward and may have a predetermined radius of curvature. The micro-lenses 166 may condense incident light received from the outside and may transmit the condensed light to the color filter layer 164. In some implementations, the end parts of the micro-lenses 166 may be formed to contact each other. In some other implementations, the end parts of the micro-lenses 166 may be spaced apart from each other by a predetermined distance so as to guarantee optical shading characteristics. Although the above embodiment in which the micro-lenses 166 are disposed only over the active pixel region 110 and the first dummy pixel region 122 have been discussed as an example of the disclosed technology, the disclosed technology is not limited thereto and other implementations are also possible. For example, the micro-lenses 166 may be disposed over the entire dummy pixel region 120, and even over the optical black pixel region 130.

A support substrate (not shown) may be formed below the wiring layer 160 for preventing the semiconductor layer 140 from being curved during the manufacturing process for making the semiconductor layer 140 thinner and lighter. The support substrate may be bonded to the wiring layer 150 through an adhesive layer. For example, the support substrate may include a semiconductor substrate, a glass substrate, and a plastic substrate.

A planarization layer (not shown) may be formed between the semiconductor layer 140 and the color filters (Rs, Gs, and Bs), and may also be formed between the light shielding layer 162 and the color filters (Rs and Gs).

Although FIG. 2 shows an example of the disclosed technology, in which the color filters are applied to a BSI (backside illumination)—based image sensing device, it should be noted that the color filters may also be applied to a FSI (frontside illumination)—based image sensing device.

FIGS. 4A to 7B are conceptual diagrams illustrating a method for forming the color filters shown in FIGS. 2 and 3. FIGS. 4A, 5A, 6A and 7A are a plan view illustrating an arrangement of the color filters, and FIGS. 4B, 5B, 6B, and 7B are a cross-sectional view illustrating the arrangement taken along the line B-B' of (a).

The explanations below in connection with FIGS. 4A to 7B are focused on the arrangement of the color filters (Rs, Gs, and Bs) and a method for forming the same. The semiconductor layer 140 and the wiring layer 150 of FIGS. 4A to 7B may be formed in the same manner as in the related art. FIGS. 4B, 5B, 6B, and 7B illustrate examples of specific implementations of the semiconductor layer 140 and the wiring layer 150.

Referring to FIGS. 4A and 4B, the wiring layer 150 may be formed over a first surface of the semiconductor layer 140, and the light shielding layer 162 may be formed over a second surface of the semiconductor layer 140 and in the optical black pixel region 130. Here, the semiconductor layer 140 may include a plurality of photoelectric conversion elements.

Subsequently, the red color filters (Rs) may be formed not only over the second surface of the semiconductor layer 140 of the active pixel region 110 and the dummy pixel region 120, but also over the light shielding layer 162.

For example, after a red resist film is formed over the entire second surface of the semiconductor layer 140 over which the light shielding layer 162 is formed, the red resist film is patterned such that red color filters (Rs) are formed. The red resist film may be formed by depositing a coating liquid including both a red coloring agent and a photoresist material over the entire second surface of the semiconductor layer 140 using the spin coating method. As such, the red resist film may be deposited over all of the active pixel region 110, the dummy pixel region 120, and the optical black pixel region 130.

In this specific example, the red resist film may be patterned to form the RGGB Bayer pattern in the active pixel region 110, the first dummy pixel region 122, and the second dummy pixel region 124. In some implementations, in each of the active pixel region 110, the first dummy pixel region 122, and the second dummy pixel region 124, the patterning process is performed in a manner that the red resist film can remain only at the position of the red color filter (R) of the Bayer pattern. In contrast, in each of the third dummy pixel region 126 and the optical black pixel region 130, the patterning process is performed in a manner that the red resist film can remain at the positions of the red and blue color filters of the Bayer pattern. In the third dummy pixel region 126 and the optical black pixel region 130, the red resist film may be patterned to form the RGGR Bayer pattern instead of the RGGB Bayer pattern.

The patterned red resist film may be processed by exposure and development, resulting in formation of red color filters (Rs) having a rectangle shape.

Figures 5A, 5B:
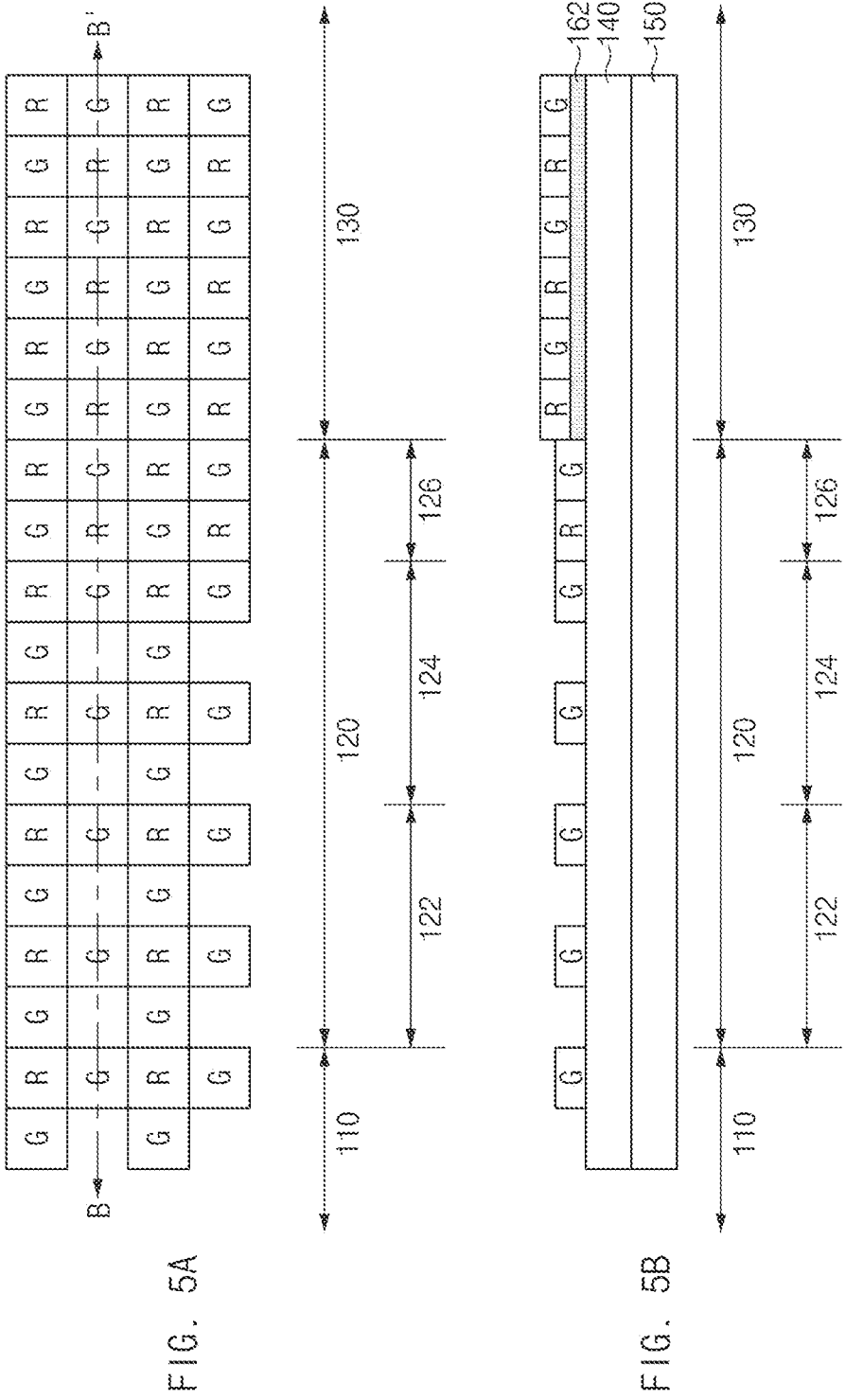

Referring to FIGS. 5A and 5B, the green color filters (Gs) may be formed between the red color filters (Rs) formed over the second surface of the semiconductor layer 140 and may also be formed between the red color filters (Rs) formed over the light shielding layer 162.

For example, after a green resist film is formed over the entire second surface of the semiconductor layer 140 so as to fill a gap between the red color filters (Rs), the green resist film is patterned such that green color filters (Gs) may be formed. The green resist film may be formed by depositing a coating liquid including both a green coloring agent and a photoresist material over the entirety of the second surface of the semiconductor layer 140 over which the red color filters (Rs) are formed, using the spin coating method.

In this case, the green resist film may be patterned to form the RGGB Bayer pattern in the active pixel region 110, the dummy pixel region 120, and the optical black pixel region 130. In some implementations, in each of the active pixel region 110, the dummy pixel region 120, and the optical black pixel region 130, the patterning process is performed in a manner that the green resist film can remain only at the position of the green color filter (G) of the Bayer pattern.

Therefore, in each of the active pixel region 110, the first dummy pixel region 122, and the second dummy pixel region 124, the red color filters (Rs) and the green color filters (Gs) may be formed to expose the semiconductor layer 140 corresponding to the blue color filters (Bs) of the Bayer pattern, and both the third dummy pixel region 126 and the optical black pixel region 130 may be covered with the red color filters (Rs) and the green color filters (Gs).

Subsequently, the patterned green resist film may be processed by exposure and development, resulting in formation of green color filters (Gs) having a rectangular shape.

Although FIGS. 4A, 4B, 5A and 5B show that the red color filters (Rs) are firstly formed before the green color filters (Gs) are formed, the order of forming the red color filters (Rs) and the green color filters (Gs) may be changed as necessary.

Referring to FIGS. 6A and 6B, a blue resist film 168 may be formed over the exposed semiconductor layer 140, the red color filters (Rs) and the green color filters (Gs). In some implementations, the blue resist film 168 may be formed to fill a gap between each red color filter (R) and each green color filter (G) and to cover the red color filters (Rs) and the green color filters (Gs).

The blue resist film 168 may be formed by depositing a coating liquid including both a blue coloring agent and a photoresist material over the entirety of the second surface of the semiconductor layer 140 over which the red color filters (Rs) and the green color filters (Gs) are formed, using the spin coating method.

In this case, due to the presence of the light shielding layer 162, the blue resist film 168 may be formed to have a step difference in a boundary region between the dummy pixel region 120 and the optical black pixel region 130.

Figure 7A:
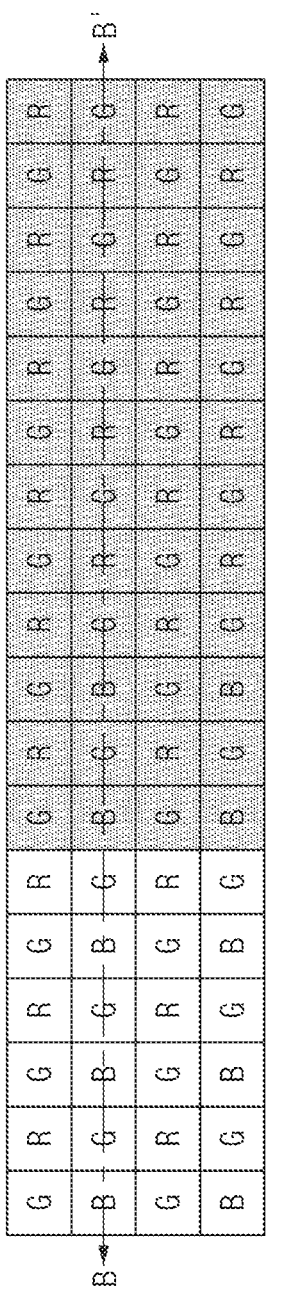
Figure 7B:
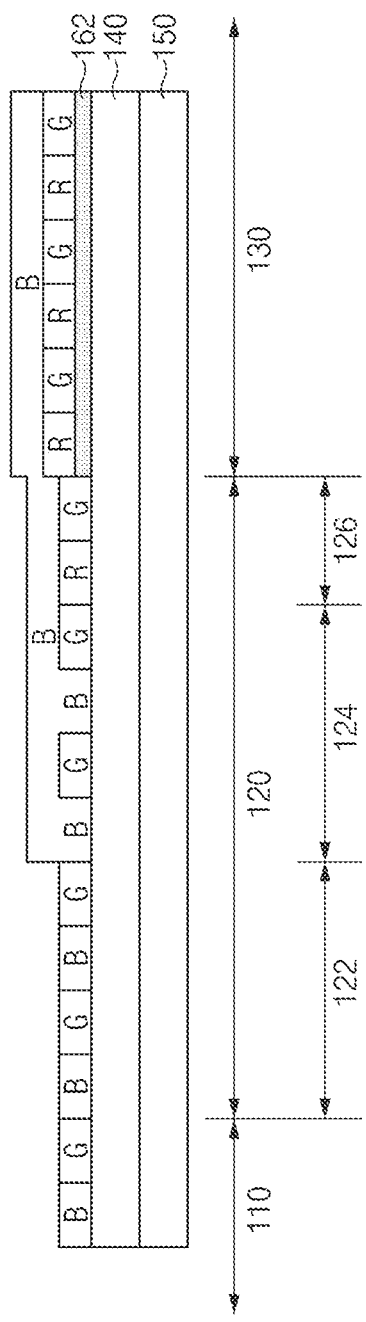

Referring to FIGS. 7A and 7B, after the blue resist film 168 is patterned, the patterned blue resist film 162 is processed by exposure and development, resulting in formation of the blue color filters (Bs).

In this case, the blue resist film 168 may be patterned to remain only in a gap between each red color filter (R) and each green color filter (G) in the active pixel region 110 and the first dummy pixel region 122, and may also be patterned to remain over the red and green color filters (Rs and Gs) in the second dummy pixel region 124, the third dummy pixel region 126, and the optical black pixel region 130.

In some implementations, the blue color filter (B) may be formed between each red color filter (R) and each green color filter (G) in the active pixel region 110 and the first dummy pixel region 122. In the second dummy pixel region 124, the blue color filter (B) may be formed not only between each red color filter (R) and each green color filter (G), but also over each of the red and green color filters. In the third dummy pixel region 126 and the optical black pixel region 130, the blue color filter (B) may be formed over the red color filters (Rs) and the green color filters (Gs).

Figure 8:
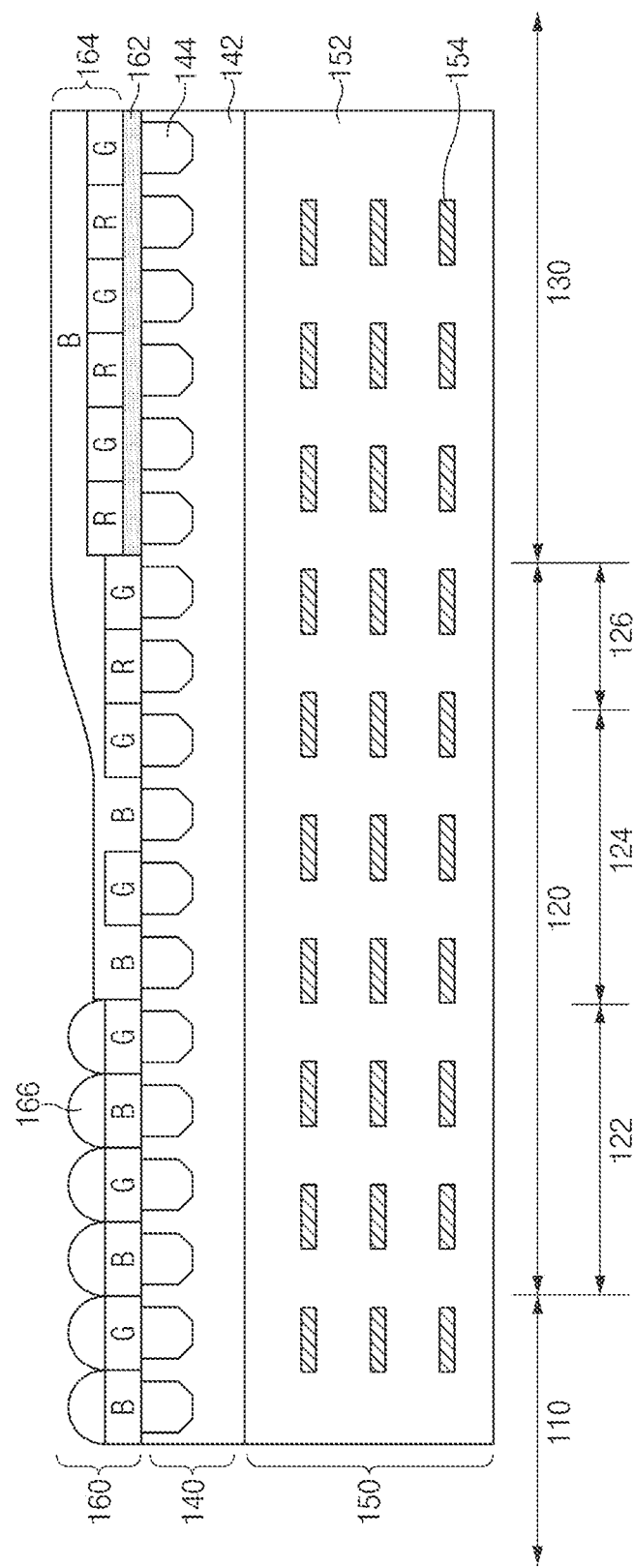
FIG. 8 is a cross-sectional view illustrating a representation of an example of an image sensing device according to another embodiment of the disclosed technology.

FIG. 8 is a cross-sectional view illustrating an image sensing device according to another embodiment of the disclosed technology.

As shown in the structure of FIG. 2, the blue color filter (B) formed over the red and green color filters (Rs and Gs) may be formed to have the same thickness in all of the second dummy pixel region 124, the third dummy pixel region 126, and the optical black pixel region 130. In this case, a large step difference may occur in the blue color filter B located at a boundary region between the dummy pixel region 120 and the optical black pixel region 130.

In order to address this issue, according to this embodiment of the disclosed technology, the blue color filter (B)

may be formed to have a smaller step difference in a boundary region between the dummy pixel region 120 and the optical black pixel region 130 as compared to one in FIG. 2. Thus, instead of having the same thickness over the third dummy pixel region 126 and the optical black pixel region 130, the blue color filter (B) in the upper filter layer in the dummy pixel region 124 has a variable thickness across the second dummy pixel region 124 and the third dummy pixel region 126. As one example, FIG. 8 shows that the thickness of the blue color filter (B) increases from a part of the second dummy pixel region 124 to the third dummy pixel region 126. Other implementations are also possible to reduce the step difference in the boundary region between the dummy pixel region 120 and the optical black pixel region 130.

As is apparent from the above description, the image sensing device according to the embodiments of the disclosed technology can allow the color filter layer formed over the light shielding layer to more efficiently absorb light reflected from the light shielding layer, thereby minimizing side effects caused by such light reflection.

What is claimed is:

1. An image sensing device comprising:
a semiconductor layer formed to include an active pixel region including photosensing pixels responsive to light to produce electrical charges or signals, an optical black pixel region separated from the active pixel region and including additional photosensing pixels responsive to light to produce electrical charges or signals, and a dummy pixel region disposed between the active pixel region and the optical black pixel region;
a light shielding layer formed over the semiconductor layer and located in the optical black pixel region to shield the additional photosensing pixels from radiation in response to receiving light incident upon the image sensing device;
a first color filter layer formed over the semiconductor layer and located in the active pixel region;
a second color filter layer located over the light shielding layer of the optical black pixel region; and
a third color filter layer formed over the semiconductor layer and located in the dummy pixel region,
wherein each of the first to third color filter layers includes at least one first color filter, at least one second color filter, and at least one third color filter,
wherein, in the second color filter layer and a part of the third color filter layer, the first color filter and the second color filter are arranged in a same layer and the third color filter is arranged in another layer different from the layer of the first and second color filters.

2. The image sensing device according to claim 1, wherein the first color filter, the second color filter, and the third color filter that are formed in the first to third color filter layers are a red color filter, a green color filter, and a blue color filter, respectively.

3. The image sensing device according to claim 2, wherein the first to third color filters are arranged in a Bayer pattern in the first color filter layer.

4. The image sensing device according to claim 3, wherein the second color filter layer includes:
a lower filter layer in which the first color filter and the second color filter are alternately arranged in a first direction and a second direction perpendicular to the first direction; and
an upper filter layer in which the third color filter covers the lower filter layer.

5. The image sensing device according to claim 1, wherein each of the first to third color filters that are formed in the first to third color filter layers has a same thickness.

6. An image sensing device comprising:
a semiconductor layer formed to include an active pixel region, a dummy pixel region, and an optical black pixel region, each of the active pixel region, the dummy pixel region, and the optical black pixel region including photosensing pixels;
a light shielding layer located in the optical black pixel region, the light shielding layer formed over the semiconductor layer and configured to shield the photosensing pixels in the optical black pixel region from radiation in response to receiving light incident upon the image sensing device; and
a color filter layer formed over the semiconductor layer and in the active region, the dummy pixel region, and the optical black pixel region,
wherein the color filter layer includes at least one first color filter, at least one second color filter, and at least one third color filter, the first, second, and third color filters configured to filter different colored lights from one another,
the color filter layer formed in the active pixel region includes the first color filter, the second color filter, and the third color filter that are arranged in a single layer, and
the color filter layer formed in a part of the dummy pixel region and the color filter layer formed in the optical black pixel region include the first color filter and the second color filter that are arranged in a same layer and the third color filter formed in another layer different from the same layer.

7. The image sensing device according to claim 6, wherein the first color filter, the second color filter, and the third color filter are a red color filter, a green color filter, and a blue color filter, respectively.

8. The image sensing device according to claim 7, wherein the first to third color filters included in the color filter layer formed in the active pixel region are arranged in a Bayer pattern.

9. The image sensing device according to claim 8, wherein the color filter layer formed over the light shielding layer includes:
a first lower filter layer in which the first color filter and the second color filter are alternately arranged in a first direction and a second direction perpendicular to the first direction; and
a first upper filter layer in which the third color filter covers the first lower filter layer.

10. The image sensing device according to claim 9, wherein the dummy pixel region includes:
a first dummy pixel region located adjacent to the active pixel region;
a second dummy pixel region located adjacent to the first dummy pixel region; and
a third dummy pixel region located between the second dummy pixel region and the optical black pixel region.

11. The image sensing device according to claim 10, wherein the first dummy pixel region includes:
a color filter layer including the first to third color filters that are arranged in a same manner as in the color filter layer of the active pixel region.

12. The image sensing device according to claim 10, wherein the second dummy pixel region includes:
a second lower filter layer in which the first to third color filters are arranged in a Bayer pattern; and a second upper filter layer in which the third color filter covers the second lower filter layer.

13. The image sensing device according to claim 12, wherein the first upper filter layer and the second upper filter layer have different thicknesses from each other.

14. The image sensing device according to claim 10, wherein the third dummy pixel region includes:
    a color filter layer including the first to third color filters that are arranged in a same manner as in the color filter layer of the optical black pixel region.

15. An image sensing device comprising:
    a semiconductor layer formed to include an active pixel region, an optical black pixel region and a dummy pixel region between the active pixel region and the optical black pixel region; and
    a color filter layer formed over the semiconductor layer, wherein the color filter layer includes at least one first color filter, at least one second color filter, and at least one third color filter, the first, second, and third color filters configured to filter different colored lights from one another,
    the color filter layer formed in the dummy pixel region and the optical black pixel region includes a lower filter layer and an upper filter layer formed over the lower filter layer,
    in the dummy pixel region, the lower filter layer includes the first to third color filters and the upper filter layer includes the third color filter,
    in the optical black pixel region, the lower filter layer includes the first color filter and the second color filter and the upper filter layer includes the third color filter.

16. The image sensing device of claim 15, wherein the first color filter, the second color filter, and the third color filter are a red color filter, a green color filter, and a blue color filter, respectively.

\* \* \* \* \*